(12) United States Patent
Gukelberger et al.

(10) Patent No.: US 11,551,130 B2
(45) Date of Patent: Jan. 10, 2023

(54) QUANTUM COMPUTING DEVICE MODEL DISCRETIZATION

(71) Applicant: Microsoft Technology Licensing, LLC, Redmond, WA (US)

(72) Inventors: Jan Philipp Gukelberger, Redmond, WA (US); Spencer James Peters, Ithaca, NY (US); John King Gamble, IV, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 626 days.

(21) Appl. No.: 16/591,443

(22) Filed: Oct. 2, 2019

(65) Prior Publication Data

US 2021/0103846 A1      Apr. 8, 2021

(51) Int. Cl.
  *G06N 10/00*     (2022.01)
  *G06F 30/23*     (2020.01)
  *G06T 17/20*     (2006.01)

(52) U.S. Cl.
  CPC ............. *G06N 10/00* (2019.01); *G06F 30/23* (2020.01); *G06T 17/20* (2013.01)

(58) Field of Classification Search
  CPC ......... G06N 10/00; G06F 30/23; G06F 17/50; G06T 17/20; B82Y 10/00; G05D 1/0248; G06Q 30/02; H01L 39/223
  See application file for complete search history.

(56) References Cited

U.S. PATENT DOCUMENTS

| | | | |
|---|---|---|---|
| 2013/0073387 A1* | 3/2013 | Heath | G06Q 30/02 705/14.53 |
| 2018/0096257 A1* | 4/2018 | Lucarelli | G06N 10/00 |

(Continued)

FOREIGN PATENT DOCUMENTS

| | | | | |
|---|---|---|---|---|
| CN | 1672171 A | * | 9/2005 | ............ G06N 10/00 |
| CN | 109709602 A | * | 5/2019 | |
| WO | WP 2017/078731 A1 | * | 5/2017 | ............ G06F 17/50 |

OTHER PUBLICATIONS

Paik et al., U.S. Patent Application Publication 2019/0236218 A1, Aug. 2019, see shortened version.*

(Continued)

*Primary Examiner* — Kandasamy Thangavelu
(74) *Attorney, Agent, or Firm* — Alleman Hall Creasman & Tuttle LLP

(57) ABSTRACT

A computing device including memory storing a quantum computing device model. The quantum computing device model may include a plurality of quantum computing device components having a respective plurality of actual boundaries. The computing device may further include a processor configured to generate a first discretized model of the quantum computing device model. The first discretized model may indicate a respective estimated boundary for each quantum computing device component. The processor may be further configured to solve a first differential equation discretized with the first discretized model. The processor may be further configured to generate a second discretized model of a focus region of the quantum computing device model. In the second discretized model, the focus region may have the estimated boundary computed for the focus region in the first discretized model. The processor may be further configured to solve a second differential equation discretized with the second discretized model.

15 Claims, 7 Drawing Sheets

(56) References Cited

U.S. PATENT DOCUMENTS

| | | | | |
|---|---|---|---|---|
| 2018/0240035 | A1* | 8/2018 | Scheer | H01L 39/223 |
| 2019/0236218 | A1* | 8/2019 | Paik | G06N 10/00 |
| 2020/0069134 | A1* | 3/2020 | Ebrahimi Afrouzi | G05D 1/0248 |

OTHER PUBLICATIONS

Ebrahimi Afrouzi et al., U.S. Patent Application Publication 2020/0069134 A1, Mar. 2020, see shortened version.*
Scheer et al., U.S. Patent Application Publication 2018/0240035 A1, Aug. 2018, see shortened version.*
Heath, S, .U.S. Patent Application Publication 2013/0073387 A1, Mar. 2013, see shortened version.*
Lucarelli, D.G., .U.S. Patent Application Publication 2018/0096257 A1, Apr. 2018, see shortened version.*
Budtz, et al., "Electrostatic Simulations For Two-Dimensional Semiconductor-Superconductor Hybrid Devices", In The Bachelor's Thesis Submitted to University Of Copenhagen Faculty Of Science Niels Bohr Institute Center For Quantum Devices, Jul. 2, 2019, 28 Pages.
Mikkelsen, et al., "Hybridization at Superconductor-Semiconductor Interfaces", In The Repository of arXiv:1801.03439v3, Aug. 28, 2018, 18 Pages.
"International Search Report and Written Opinion Issued in PCT Application No. PCT/US20/047286", dated Nov. 23, 2020, 19 Pages.
"Quantum Transport Simulations Made Easy", Retrieved from: https://kwant-project.org/, Retrieved Date: Sep. 11, 2019, 01 Page.
Antipov, et al., "Effects of Gate-Induced Electric Fields on Semiconductor Majorana Nanowires", In Journal of Physical Review X, vol. 8, Issue 3, Aug. 13, 2018, 19 Pages.
Groth, et al., "Kwant 1.4.0 Documentation", Retrieved from: https://downloads.kwant-project.org/doc/latest.pdf, Mar. 6, 2019, 207 Pages.
Tan, et al., "A Self-Consistent Solution of Schrodinger-Poisson Equations Using a Nonuniform Mesh", In Journal of Applied Physics, vol. 68, Issue 8, Oct. 15, 1990, pp. 4071-4076.
Ninkler, et al., "Unified Numerical Approach to Topological Semiconductor-Superconductor Heterostructures", In Journal of Physical Review B, vol. 99, Issue 24, Jun. 13, 2019, 16 Pages.

* cited by examiner

QUANTUM COMPUTING DEVICE MODEL DISCRETIZATION

BACKGROUND

Research into the construction of quantum computing devices frequently involves performing computer simulations of the physical properties of quantum computing device architectures. These simulations allow quantum computing devices to be designed and optimized much more quickly than approaches that rely solely on frequent experimental testing of quantum computing device architectures. In order to achieve this acceleration in the quantum computing device development cycle, simulations of the quantum computing devices require high levels of accuracy and typically use large amounts of computing resources.

SUMMARY

According to one aspect of the present disclosure, a computing device is provided, including memory storing a quantum computing device model. The quantum computing device model may include a plurality of quantum computing device components having a respective plurality of actual boundaries. The computing device may further include a processor configured to generate a first discretized model of the quantum computing device model. The first discretized model may divide the quantum computing device model into a first plurality of cells and may indicate a respective estimated boundary for each quantum computing device component. The processor may be further configured to solve a first differential equation discretized with the first discretized model. The processor may be further configured to generate a second discretized model of a focus region of the quantum computing device model. The second discretized model may divide the focus region into a second plurality of cells. In the second discretized model, the focus region may have the estimated boundary computed for the focus region in the first discretized model. The processor may be further configured to solve a second differential equation discretized with the second discretized model.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

When a computer simulation of a quantum computing device is performed, the simulation typically models different portions of the quantum computing device at different resolution levels. For example, a model of a superconductor included in the quantum computing device may be modeled at a higher resolution (corresponding to a shorter length scale) than a semiconductor included in the same quantum computing device. Each region that is modeled may be discretized, and a respective differential equation may be solved numerically over the region using the discretization.

When portions of a quantum computing device are simulated at different length scales, the simulation of the quantum computing device may include boundaries between regions of the quantum computing device that are discretized with different resolutions. In some instances, areas of the model near a boundary may be erroneously treated as included in more than one component of the quantum computing device due to differences in the location of the boundary in different discretizations. For example, a point near the boundary between a semiconductor and a superconductor may be modeled as though it were both a semiconductor and a superconductor, leading to unphysical results that do not match experimentally observed behavior of the quantum computing device. Similarly, a point near a boundary may be modeled as though it were not included in any component of the quantum computing device.

In addition, differences in resolution may lead to unphysical results when multiple differential equations are solved over a region of the quantum computing device and the results of one differential equation are used as inputs when solving another differential equation. For example, if an electrostatic potential is computed for a quantum computing device component that is discretized at a low resolution, unphysical artifacts may occur if the computed electrostatic potential is used as an input when solving the Bogoliubov-de Gennes equation within a superconductor at a higher resolution.

Figure 1:
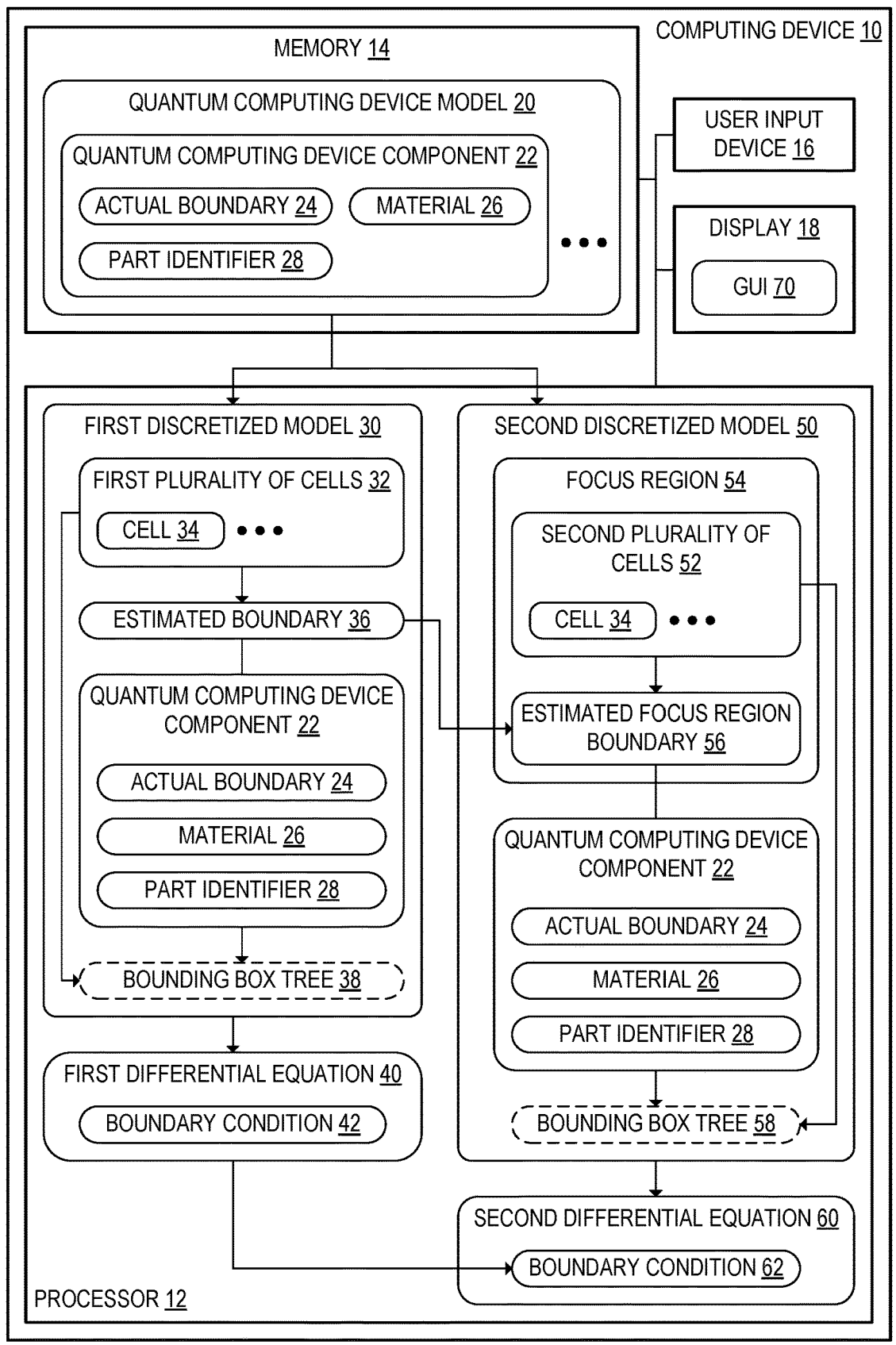
FIG. 1 schematically shows an example computing device including memory storing a quantum computing device model, according to one embodiment of the present disclosure.

In order to address the problems discussed above and allow more accurate simulation of quantum computing devices, a computing device 10 is provided, as schematically depicted in FIG. 1. The computing device 10 may include a processor 12 and memory 14, which may be operatively coupled. The processor 12 and the memory 14 may each be instantiated in one or more physical components such as one or more processor cores and/or one or more physical memory modules. In some embodiments, the functions of the computing device 10 may be distributed across a plurality of communicatively coupled computing devices. The computing device 10 may further include one or more user input devices 16. In addition, the computing device 10 may further include one or more output devices, which may include a display 18. The display 18 may be configured to display a graphical user interface (GUI) 70 via which a user may view output communicated to the display 18 by the processor 12. The GUI 70 may be further configured to receive user input via the one or more user input devices 16.

The memory 14 of the computing device 10 may store a quantum computing device model 20. The quantum computing device model 20 may include a plurality of quantum computing device components 22 having a respective plurality of actual boundaries 24. For example, the quantum computing device model 20 may be a computer-aided design (CAD) model of a quantum computing device. In some embodiments, the quantum computing device model 20 may be a two-dimensional model of a cross-section of a quantum computing device. In other embodiments, the quantum computing device model may be a three-dimensional model. The plurality of quantum computing device components 22 may be indicated in the quantum computing device model 20 as non-overlapping regions of a two-dimensional space or a three-dimensional volume.

Figure 2:
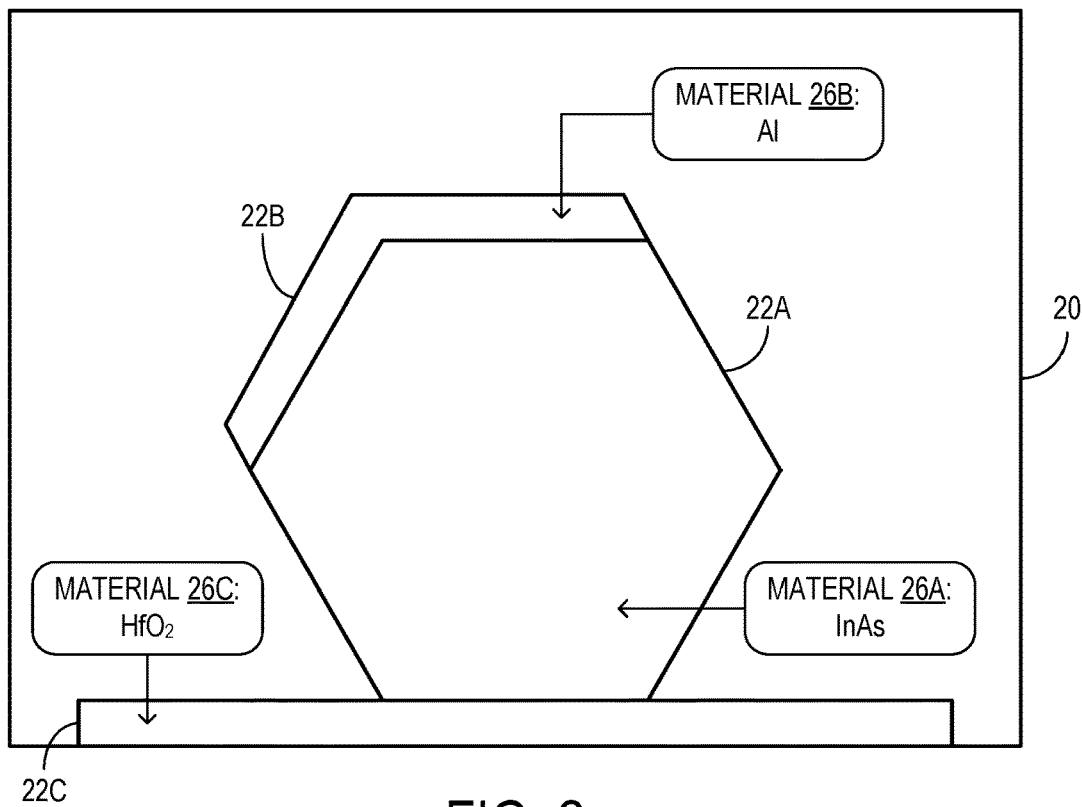
FIG. 2 shows an example quantum computing device model, according to the embodiment of FIG. 1.

An example quantum computing device model 20 is depicted in FIG. 2. In the example of FIG. 2, the quantum computing device model 20 is a two-dimensional model of a cross-section of a two-facet nanowire. The quantum computing device components 22 shown in the cross-section are a semiconductor 22A, a superconductor 22B, and a gate dielectric 22C. One of the actual boundaries 24 shown in the example of FIG. 2 is a boundary between the semiconductor 22A and the superconductor 22B. As discussed above, discretization artifacts may occur at boundaries between semiconductors and superconductors when existing methods of modeling quantum computing devices are used. The quantum computing device model 20 may, in some embodiments, further indicate a respective material 26 of each quantum computing device component 22. In the example of FIG. 2, the material 26A of the semiconductor 22A is indium arsenide, the material 26B of the superconductor 22B is aluminum, and the material 26C of the gate dielectric 22C is hafnium dioxide.

The memory 14 may further store a respective part identifier 28 associated with each quantum computing device component 22. The memory 14 may indicate the respective materials 26 of the quantum computing device components 22 by storing a table associating each part identifier 28 with a material 26.

Returning to FIG. 1, the processor 12 may be configured to generate a first discretized model 30 of the quantum computing device model 20. The first discretized model 30 may divide the quantum computing device model 20 into a first plurality of cells 32. The cells 34 included in the first plurality of cells 32 may be non-overlapping regions of the quantum computing device model 20, such that no points in the quantum computing device model 20 are included in two or more cells 34 at a time. In embodiments in which the quantum computing device model 20 is a two-dimensional model, each cell 34 may be a rectangular cell or may have some other shape. In embodiments in which the quantum computing device model 20 is a three-dimensional model, each cell 34 may be a rectangular prism or may have some other three-dimensional form.

In addition, the first discretized model 30 may indicate a respective estimated boundary 36 for each quantum computing device component 22. In some embodiments, the estimated boundary 36 of a quantum computing device component 22 may differ from the actual boundary 24 indicated for that quantum computing device component 22 in the quantum computing device model 20. The first discretized model 30 may indicate the estimated boundaries 36 of the quantum computing device components 22 with a table that maps points in space to part identifiers 28 of quantum computing device components 22.

Figure 3:
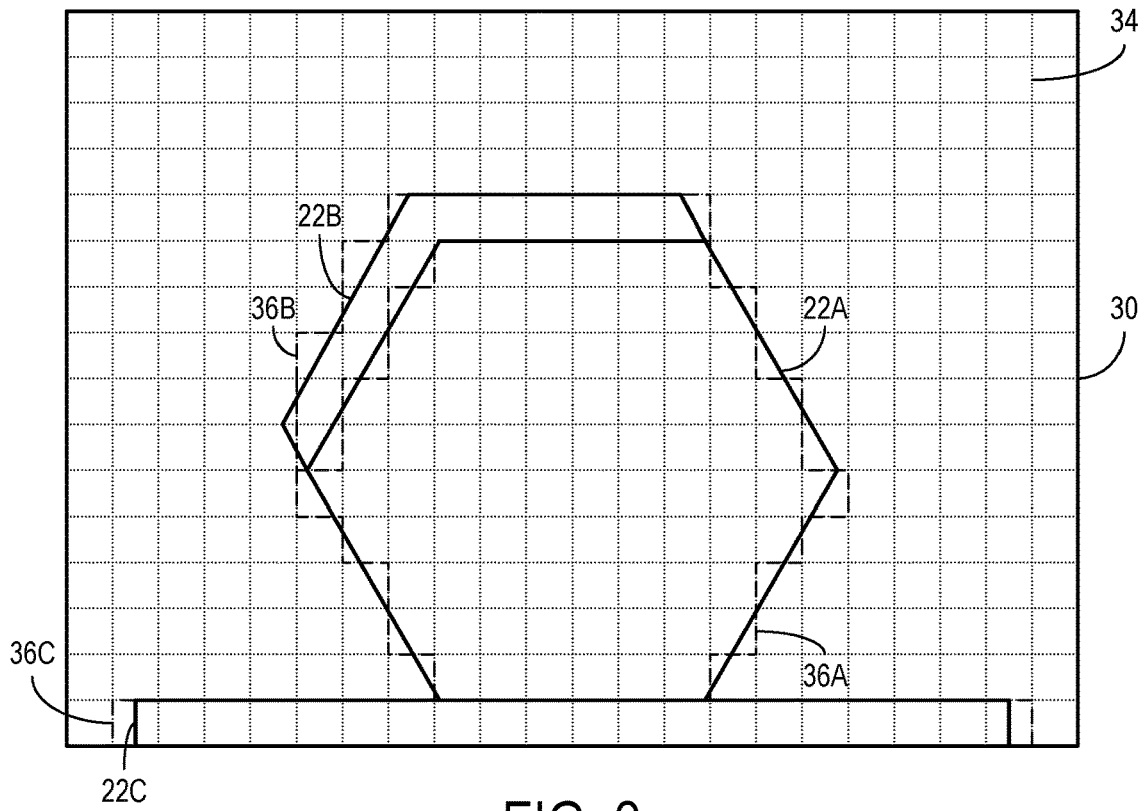
FIG. 3 shows an example first discretized model of the quantum computing device model of FIG. 2, wherein the first discretized model is a finite difference model.

FIG. 3 shows an example first discretized model 30 generated from the quantum computing device model 20 of FIG. 2. In the example of FIG. 3, the quantum computing device model 20 is divided into a plurality of square cells 34. Since the respective shapes of the semiconductor 22A and the superconductor 22B are not perfectly matched by collections of squares, the respective estimated boundaries 36A and 36B of the semiconductor 22A and the superconductor 22B do not match their respective actual boundaries 24. In contrast, the estimated boundary 36C of the gate dielectric 22C matches the actual boundary 24 of the gate dielectric 22C.

Returning to FIG. 1, The processor 12 may be further configured to solve a first differential equation 40 discretized with the first discretized model 30. For example, the first differential equation 40 may be selected from the group consisting of a Schrödinger equation, a Poisson equation, and a Bogoliubov-de Gennes equation. For example, the first differential equation 40 may be a nonlinear Poisson equation with a Thomas-Fermi density functional. The processor 12 may use the first discretized model 30 to specify a plurality of discrete spatial steps at which a numerical solution to the first differential equation 40 is estimated. In addition, the first differential equation 40 may have one or more boundary conditions 42 specified by the first discretized model 30. For example, when the processor 12 solves an electrostatics-related differential equation, a boundary condition 42 may specify that an electric field inside an electrical conductor is zero.

In some embodiments, the first discretized model 30 may be a finite difference model. In such embodiments, the finite difference model may divide the quantum computing device model 20 into a grid of rectangular cells 34, as shown in the example of FIG. 3. Points at the respective centers of the rectangular cells 34 may, for example, be the discrete spatial points at which the processor 12 estimates the numerical solution to the first differential equation 40.

Figure 4:
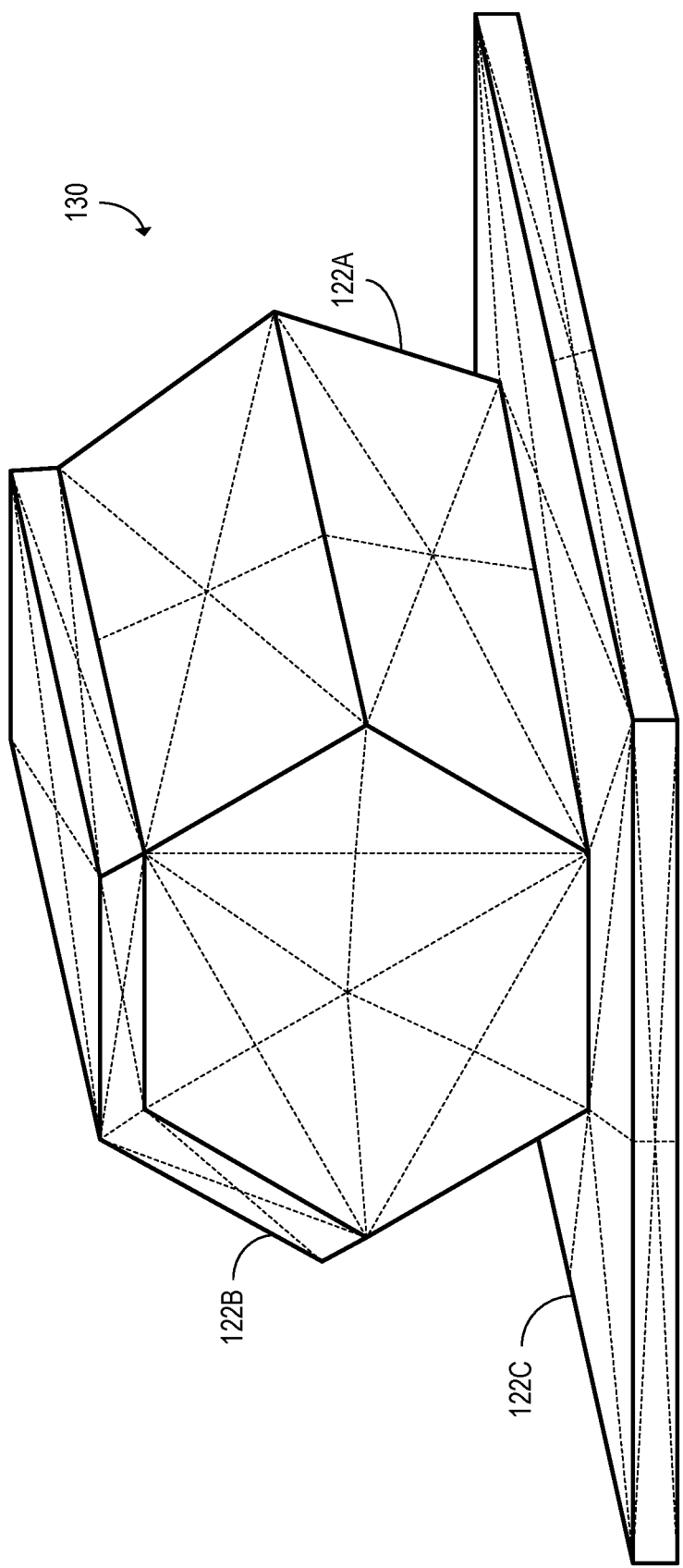
FIG. 4 shows another example first discretized model that is a finite element model, according to the embodiment of FIG. 1.

In other embodiments, the first discretized model 30 may be a finite element model. In such embodiments, when the quantum computing device model 20 is a two-dimensional model, the first discretized model 30 may include one or more cells 34 that are non-rectangular in shape. When the quantum computing device model 20 is a three-dimensional model, the finite element model may include a three-dimensional mesh that includes a plurality of tetrahedra or hexahedra. FIG. 4 shows an example first discretized model 130 of a three-dimensional quantum computing device model 20 of a portion of a hexagonal nanowire with an aluminum shell covering two wire facets. In the example of FIG. 4, the first discretized model 130 is a mesh that discretizes three-dimensional forms indicating a semiconductor 122A, a superconductor 122B, and a backgate 122C. In some embodiments, as shown in FIG. 4, the estimated boundary 36 may coincide with the actual boundary 24 of one or more of the quantum computing device components 22. In other embodiments, such as when curved components are used, the estimated boundary 36 may differ from the actual boundary 24.

Returning to FIG. 1, when a finite element model is used for the first discretized model 30, the finite element model may include a bounding box tree 38 indicating, for each of the quantum computing device components 22, one or more cells 34 of the finite element model corresponding to that quantum computing device component 22. For example, the bounding box tree 38 may associate each cell 34 with a part identifier 28 of a quantum computing device component 22 in which that cell 34 is included. Thus, the bounding box tree 38 may encode inclusion relations between the cells 34 of the finite element model and the plurality of quantum computing device components 22. In some embodiments, each bounding box included in the bounding box tree 38 may be rectangular. The bounding box tree 38, in such embodiments, may be an axis aligned bounding box tree. In other embodiments, the plurality of bounding boxes of the quantum computing device components 22 and cells 34 may be aligned along different axes.

The processor 12 may be further configured to generate a second discretized model 50 of a focus region 54 of the quantum computing device model 20. The focus region 54 may be a region of the quantum computing device model 20 for which a different length scale from that of the first discretized model 30 is used in the simulation of the quantum computing device. For example, the focus region 54 may encompass a specific quantum computing device component 22 or a plurality of such quantum computing device components 22. The second discretized model 50 may divide the focus region 54 into a second plurality of cells 52. One or more of the second plurality of cells 52 may be smaller than one or more of the first plurality of cells 32. In some embodiments, each cell 34 included in the second plurality of cells 52 may be smaller than each cell 34 included in the first plurality of cells 32.

The second discretized model 50 includes an estimated focus region boundary 56 that delimits the focus region 54. The focus region 54 of the second discretized model 50 may be bounded at least in part by the estimated boundary 36 indicated in the first discretized model 30 for a quantum computing device component 22 of the plurality of quantum computing device components 22. In some embodiments, the estimated focus region boundary 56 may include one or more portions not specified by the estimated boundary 36, such as an internal boundary within a quantum computing device component 22.

The second discretized model 50 may further indicate one or more quantum computing device components 22 included in the focus region 54. For example, similarly to the first discretized model 30, the focus region 54 may indicate the respective estimated boundaries 36 of one or more quantum computing device components 22 with a table that maps points in space to part identifiers 28 of quantum computing device components 22.

By using the estimated boundary 36 from the first discretized model 30 when delimiting the focus region 54, the processor 12 is configured to avoid treating points in the quantum computing device model 20 as though they were included in more than one material or no material. Thus, unphysical artifacts that lead the simulation to produce inaccurate results may be avoided when changing the resolution of the simulation in the focus region 54.

In some embodiments, the processor 12 may configured to solve a respective plurality of differential equations for a plurality of quantum computing device components 22. Boundaries between the quantum computing device components 22 included in the quantum computing device model 20 may be set such that the respective estimated focus region boundaries 56 of those quantum computing device components are consistent when each of the plurality of differential equations. Thus, artifacts may be prevented from occurring at internal boundaries between quantum computing device components 22 of the quantum computing device model 20.

Figure 5:
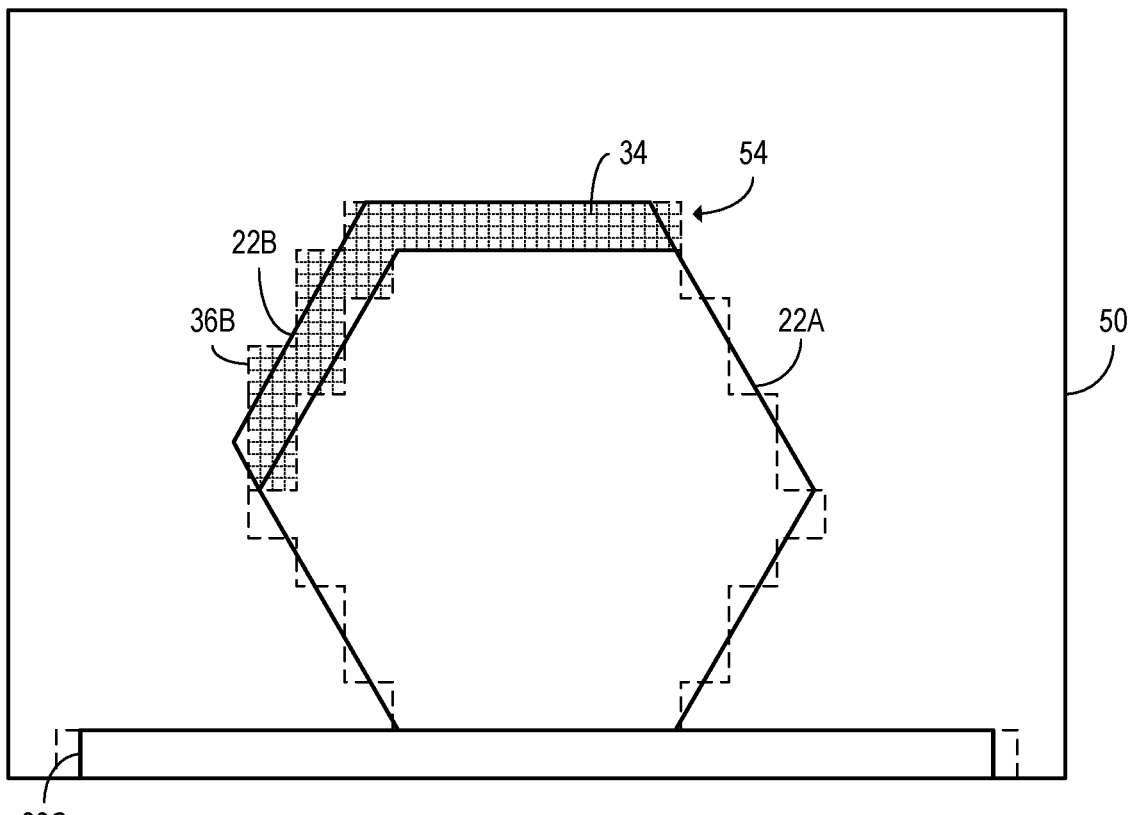
FIG. 5 shows an example second discretized model generated from the quantum computing device model of FIG. 2 and the first discretized model of FIG. 3.

FIG. 5 shows an example of a second discretized model 50 generated based on the first discretized model of FIG. 3. As shown in FIG. 5, the focus region 54 is the region of the first discretized model 30 that corresponds to the superconductor 22B. The boundary of the focus region 54 is the estimated boundary 36 that was computed for the superconductor 22B when the first discretized model 30 was computed. In addition, each cell 34 included in the second plurality of cells 52 of the second discretized model 50 is smaller than each cell 34 included in the first plurality of cells 32 of the first discretized model 30. Even though the higher resolution of the second discretized model 50 would allow the estimated focus region boundary 56 to be drawn with a shape that more closely matches the shape of the superconductor 22B, the estimated boundary 36 of the superconductor 22B from the first discretized model 30 is used instead. In the example of FIG. 5, the estimated focus region boundary 56 is the estimated boundary 36B of the superconductor 22B.

In some embodiments, the first discretized model 30 and the second discretized model 50 may differ in dimensionality such that one of the first discretized model 30 and the second discretized model 50 is two-dimensional and the other is three-dimensional. In addition, the processor 12 may be configured to switch from a finite element model to a finite difference model or from a finite difference model to a finite element model when the second discretized model 50 is generated. For example, the processor 12 may be configured to use a finite element model as the first discretized model 30 in three dimensions. The processor 12 may be further configured to extract a two-dimensional cross section of the first discretized model 30 and generate the second discretized model 50 from the cross section. In this example, the second discretized model 50 may be a finite difference model.

The processor 12 may be further configured to solve a second differential equation 60 discretized with the second discretized model 50. Similarly to the first differential equation 40, the second differential equation 60 may be selected from the group consisting of a Schrödinger equation, a Poisson equation, and a Bogoliubov-de Gennes equation. In some embodiments, the second differential equation 60 may have one or more boundary conditions 62 that are set based on a solution to the first differential equation 40. For example, the one or more boundary conditions 62 may be set to maintain spatial continuity and normalizability of a wavefunction. Additionally or alternatively to the one or more boundary conditions 62, one or more other parameters of the second differential equation 60 may be set based on the solution to the first differential equation 40.

Figure 6:
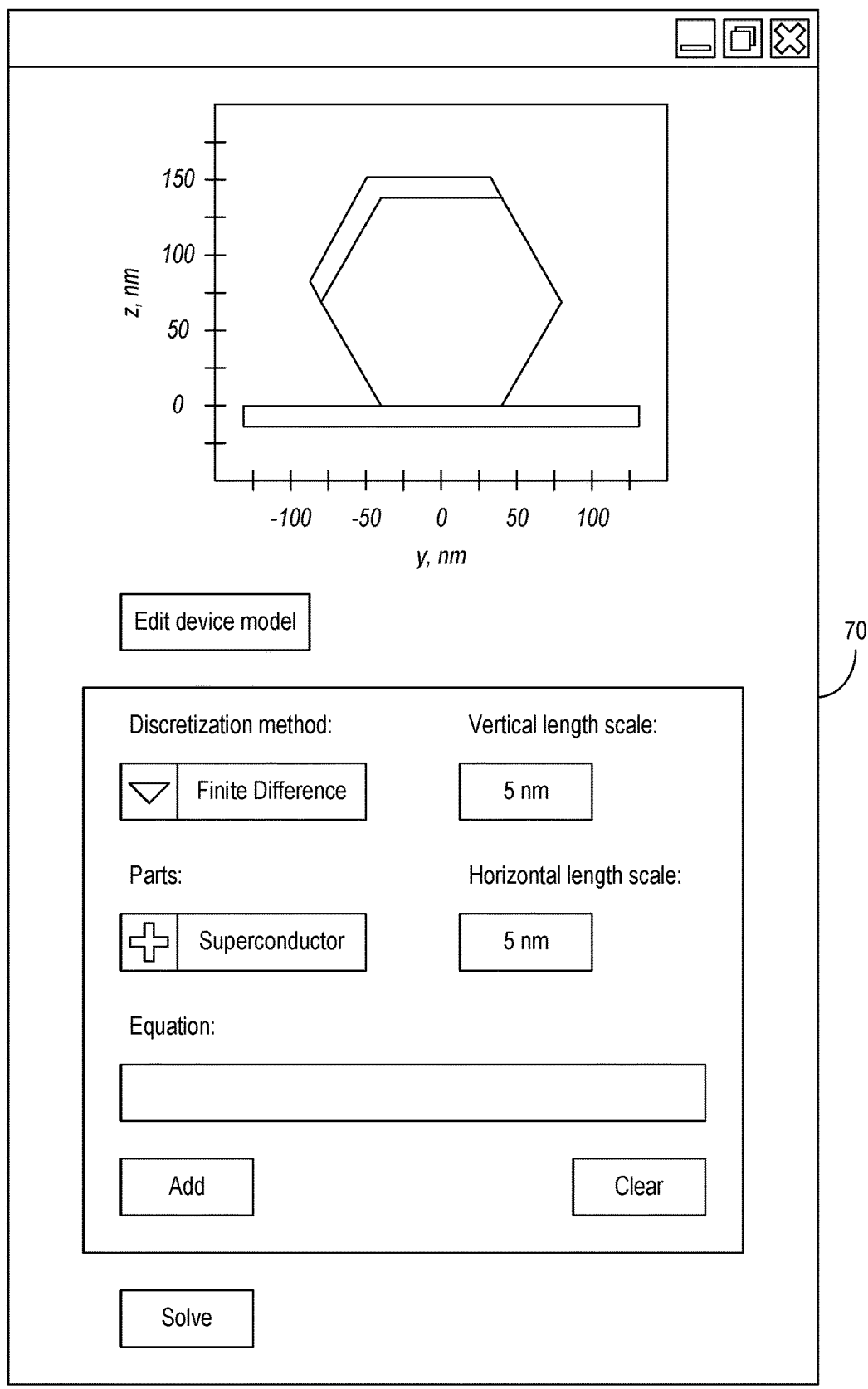
FIG. 6 shows an example graphical user interface of the computing device of FIG. 1.

FIG. 6 shows an example of a GUI 70 which the processor 12 may be further configured to output for display on the display 18. Via the one or more user input devices 16 included in the computing device 10, the processor 12 may be further configured to receive user input at the GUI 70. The user input may specify one or more parameters of the quantum computing device model, the first discretized model, the second discretized model, the first differential equation, and/or the second differential equation. The example of FIG. 6 shows the quantum computing device model 20 of FIG. 2 along with a selectable GUI element labeled "Edit device model." In response to selection of this GUI element with a user input device 16, the processor 12 may be further configured to output, for display in the GUI 70, one or more additional GUI elements via which the user may modify properties of the quantum computing device model 20. In addition, FIG. 6 shows GUI elements via which the user may set the parameters of a discretized model and specify a differential equation to solve over the discretized model. In response to a selection of the "Solve" GUI element, the processor 12 may be further configured to output a solution to the differential equation specified by the user for display on the display 18. The discretized model and the differential equation specified by the user in the example of FIG. 6 may be the first discretized model 30 and the first differential equation 40 respectively or may alternatively be the second discretized model 50 and the second differential equation 60.

Figure 7:
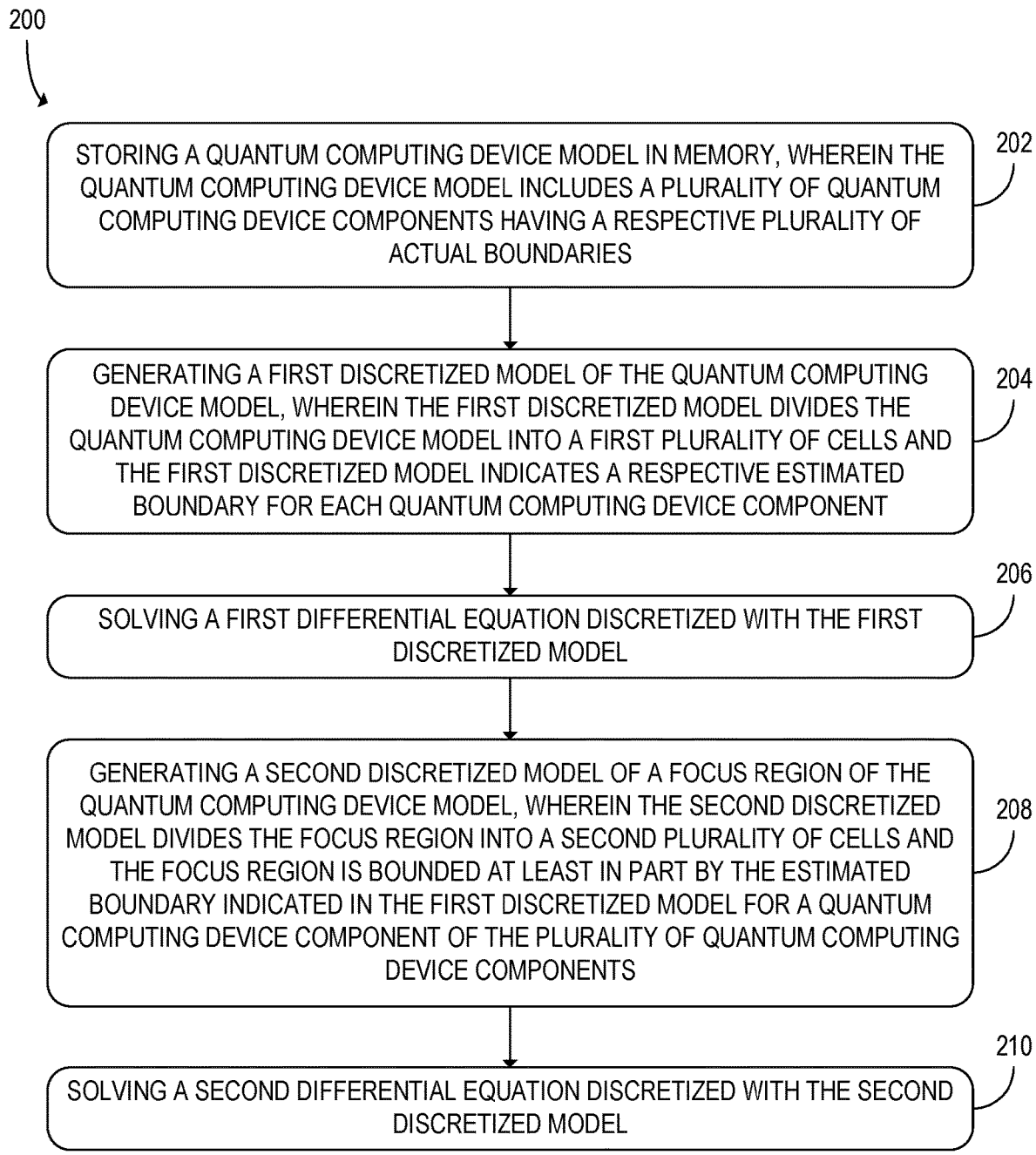
FIG. 7 shows a flowchart of an example method that may be used with a computing device, according to the embodiment of FIG. 1.

FIG. 7 shows a flowchart of an example method 200 for use with a computing device, which may be the computing device 10 of FIG. 1 or some other computing device. At step 202, the method 200 may include storing a quantum computing device model in memory. The quantum computing device model may include a plurality of quantum computing device components, which may have a respective plurality of actual boundaries. The quantum computing device model may be a two-dimensional model or a three-dimensional model. In addition, the quantum computing device model may further indicate a respective material of each quantum computing device component. In embodiments in which the quantum computing device model indicates respective materials of the quantum computing device components, at least one actual boundary of the plurality of actual boundaries included in the quantum computing device model may be a boundary between a superconductor and a semiconductor. The quantum computing device model may further include a part identifier for each quantum computing device component.

At step 204, the method 200 may further include generating a first discretized model of the quantum computing device model. The first discretized model may divide the quantum computing device model into a first plurality of cells. In addition, the first discretized model may indicate a respective estimated boundary for each quantum computing device component. The first discretized model may be a two-dimensional model or a three-dimensional model.

In some embodiments, the first discretized model may be a finite difference model. In embodiments in which the first discretized model is a finite difference model, the finite difference model may divide the quantum computing device model into a grid of rectangular cells. Alternatively, the first discretized model may be a finite element model. The plurality of cells included in the finite element model may be triangular (when the finite element model is two-dimensional) or tetrahedral (when the finite element model is three-dimensional). In embodiments in which the first discretized model is a finite element model, the finite element model may include a bounding box tree. The bounding box tree may indicate, for each of the quantum computing device components, one or more cells of the finite element model corresponding to that quantum computing device component. The bounding box tree may, for example, be an axis aligned bounding box tree.

At step 206, the method 200 may further include solving a first differential equation discretized with the first discretized model. For example, the first differential equation may be selected from the group consisting of a Schrödinger equation, a Poisson equation, and a Bogoliubov-de Gennes equation. Alternatively, other differential equations may be used.

At step 208, the method 200 may further include generating a second discretized model of a focus region of the quantum computing device model. The focus region may be a region of the quantum computing device model for which a different resolution or discretization method from that of the first discretization model is used. For example, the focus region may be a quantum computing device component of the plurality of quantum computing device components. The focus region may be bounded at least in part by the estimated boundary indicated in the first discretized model for a quantum computing device component of the plurality of quantum computing device components. Thus, at least a portion of the boundary of the focus region is carried over from the first discretized model in order to maintain consistency between the two discretized models.

The second discretized model may divide the focus region into a second plurality of cells. In some embodiments, one or more of the second plurality of cells may be smaller than one or more of the first plurality of cells. Similarly to the first discretized model, the second discretized model may be a finite difference model or a finite element model. When a finite difference model is used, the finite difference model may divide the focus region into a grid of rectangular cells. When a finite element model is used, the finite element model may include a bounding box tree, as in the first discretized model.

Figure 8:
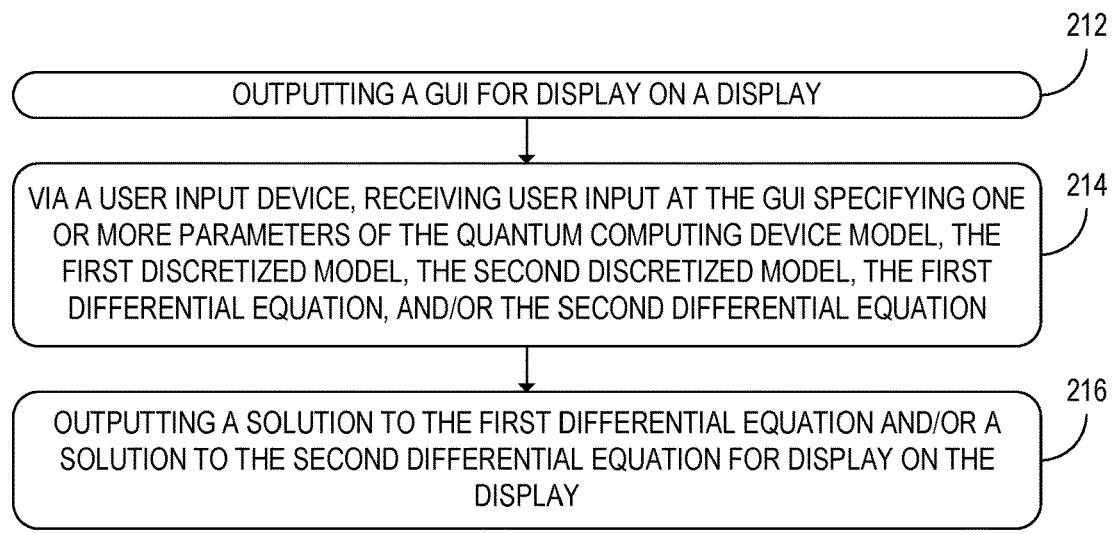
FIG. 8 shows additional steps that may be performed when performing the method of FIG. 7.

FIG. 8 shows additional steps of the method 200 of FIG. 7 that may be performed in embodiments in which the computing device at which the method 200 is performed further includes a display and a user input device. In such embodiments, the method may further include, at step 212, outputting a GUI for display on the display. The method 200 may further include, at step 214, receiving user input at the GUI via the user input device. The user input may specify one or more parameters of the quantum computing device model, the first discretized model, the second discretized model, the first differential equation, and/or the second differential equation. In response to receiving the user input, the method 200 may further include, at step 216, outputting a solution to the first differential equation and/or a solution to the second differential equation for display on the display.

Although the above description of the devices and methods disclosed herein refers to a first discretized model and a second discretized model, more than two discretized models may be used in some embodiments when simulating a quantum computing device. For example, a third discretized model at a higher resolution than the second discretized model may be generated for at least a portion of the focus region. When such a third discretized model is generated, the second discretized model may be treated as the first discretized model, and the above methods for generating the second discretized model may be used to generate the third discretized model. Thus, the processor may iteratively generate nested discretized models with different length scales. Additionally or alternatively, a plurality of second discretized models may be generated using the estimated boundaries computed for the quantum computing device components in the first discretized model. These second discretized models may have the same resolution or different resolutions.

Using the devices and methods discussed above, errors that result from setting inconsistent boundaries for quantum computing device components may be avoided when performing computer simulations of quantum computing devices. By using the boundaries defined for quantum computing device components in the first discretization when selecting the focus region of the second discretization, a user performing a simulation of a quantum computing device may avoid the occurrence of unphysical artifacts that may otherwise occur at the boundaries between quantum computing device components. Although the above example embodiments are described with reference to simulating a quantum computing device, the systems and methods described above may also be applied to simulating the physical properties of other types of devices.

In some embodiments, the methods and processes described herein may be tied to a computing system of one or more computing devices. In particular, such methods and processes may be implemented as a computer-application program or service, an application-programming interface (API), a library, and/or other computer-program product.

Figure 9:
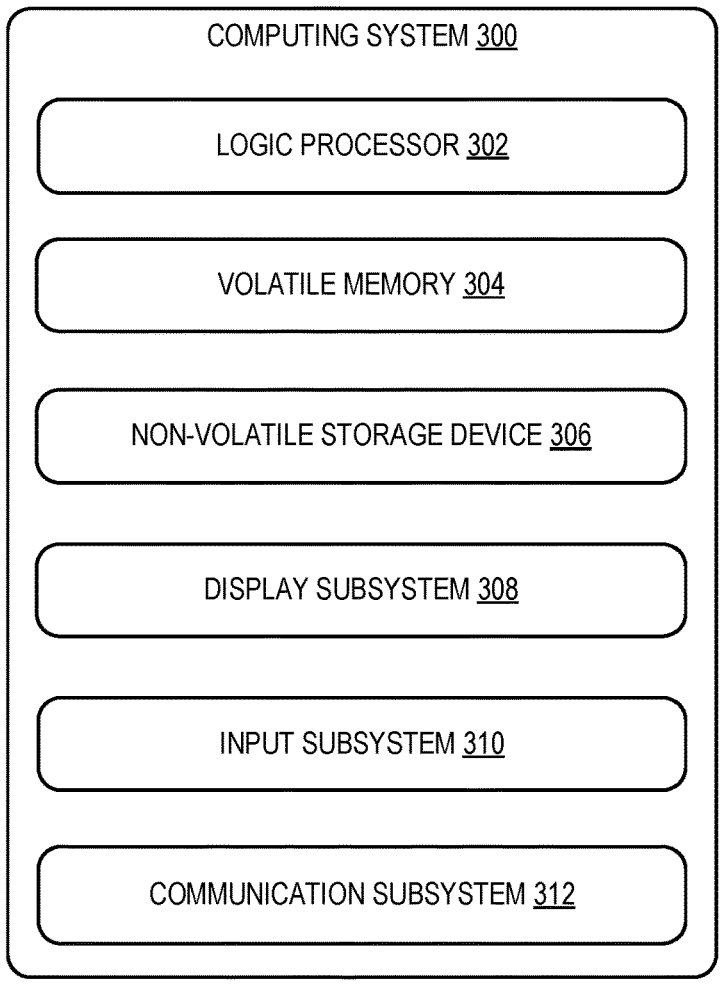
FIG. 9 shows a schematic view of an example computing environment in which the computer device of FIG. 1 may be enacted.

FIG. 9 schematically shows a non-limiting embodiment of a computing system 300 that can enact one or more of the methods and processes described above. Computing system 300 is shown in simplified form. Computing system 300 may embody the computing device 10 described above and illustrated in FIG. 1. Computing system 300 may take the form of one or more personal computers, server computers, tablet computers, home-entertainment computers, network computing devices, gaming devices, mobile computing devices, mobile communication devices (e.g., smartphone), and/or other computing devices, and wearable computing devices such as smart wristwatches and head mounted augmented reality devices.

Computing system 300 includes a logic processor 302 volatile memory 304, and a non-volatile storage device 306. Computing system 300 may optionally include a display subsystem 308, input subsystem 310, communication subsystem 312, and/or other components not shown in FIG. 9.

Logic processor 302 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 302 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 306 includes one or more physical devices configured to hold instructions executable by the logic processors to implement the methods and processes described herein. When such methods and processes are implemented, the state of non-volatile storage device 306 may be transformed—e.g., to hold different data.

Non-volatile storage device 306 may include physical devices that are removable and/or built-in. Non-volatile storage device 306 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 306 may include nonvolatile, dynamic, static, read/write, read-only, sequential-access, location-addressable, file-addressable, and/or content-addressable devices. It will be appreciated that non-volatile storage device 306 is configured to hold instructions even when power is cut to the non-volatile storage device 306.

Volatile memory 304 may include physical devices that include random access memory. Volatile memory 304 is typically utilized by logic processor 302 to temporarily store information during processing of software instructions. It will be appreciated that volatile memory 304 typically does not continue to store instructions when power is cut to the volatile memory 304.

Aspects of logic processor 302, volatile memory 304, and non-volatile storage device 306 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 300 typically implemented in software by a processor to perform a particular function using portions of volatile memory, which function involves transformative processing that specially configures the processor to perform the function. Thus, a module, program, or engine may be instantiated via logic processor 302 executing instructions held by non-volatile storage device 306, using portions of volatile memory 304. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 308 may be used to present a visual representation of data held by non-volatile storage device 306. The visual representation may take the form of a graphical user interface (GUI). As the herein described methods and processes change the data held by the non-volatile storage device, and thus transform the state of the non-volatile storage device, the state of display subsystem 308 may likewise be transformed to visually represent changes in the underlying data. Display subsystem 308 may include one or more display devices utilizing virtually any type of technology. Such display devices may be combined with logic processor 302, volatile memory 304, and/or non-volatile storage device 306 in a shared enclosure, or such display devices may be peripheral display devices.

When included, input subsystem 310 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 312 may be configured to communicatively couple various computing devices described herein with each other, and with other devices. Communication subsystem 312 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 300 to send and/or receive messages to and/or from other devices via a network such as the Internet.

According to one aspect of the present disclosure, a computing device is provided, including memory storing a quantum computing device model. The quantum computing device model may include a plurality of quantum computing device components having a respective plurality of actual boundaries. The computing device may further include a processor configured to generate a first discretized model of the quantum computing device model. The first discretized model may divide the quantum computing device model into a first plurality of cells. The first discretized model may indicate a respective estimated boundary for each quantum computing device component. The processor may be further configured to solve a first differential equation discretized with the first discretized model. The processor may be further configured to generate a second discretized model of a focus region of the quantum computing device model. The second discretized model may divide the focus region into a second plurality of cells. The focus region may be bounded at least in part by the estimated boundary indicated in the first discretized model for a quantum computing device component of the plurality of quantum computing device components. The processor may be further configured to solve a second differential equation discretized with the second discretized model.

According to this aspect, the quantum computing device model may further indicate a respective material of each quantum computing device component.

According to this aspect, at least one actual boundary of the plurality of actual boundaries included in the quantum computing device model may be a boundary between a superconductor and a semiconductor.

According to this aspect, at least one of the first discretized model and the second discretized model may be a finite difference model.

According to this aspect, the finite difference model may divide the quantum computing device model into a grid of rectangular cells.

According to this aspect, at least one of the first discretized model and the second discretized model may be a finite element model.

According to this aspect, the finite element model may include a bounding box tree indicating, for each of the quantum computing device components, one or more cells of the finite element model corresponding to that quantum computing device component.

According to this aspect, one or more of the second plurality of cells may be smaller than one or more of the first plurality of cells.

According to this aspect, the first differential equation and the second differential equation may each be selected from the group consisting of a Schrödinger equation, a Poisson equation, and a Bogoliubov-de Gennes equation.

According to this aspect, the quantum computing device model may be a two-dimensional model.

According to this aspect, the quantum computing device model may be a three-dimensional model.

According to this aspect, the computing device may further include a display and a user input device. The processor may be further configured to output a graphical user interface (GUI) for display on the display. Via the user input device, the processor may be further configured to receive user input at the GUI specifying one or more parameters of the quantum computing device model, the first discretized model, the second discretized model, the first differential equation, and/or the second differential equation. The processor may be further configured to output a solution to the first differential equation and/or a solution to the second differential equation for display on the display.

According to another aspect of the present disclosure, a method for use with a computing device is provided. The method may include storing a quantum computing device model in memory. The quantum computing device model may include a plurality of quantum computing device components having a respective plurality of actual boundaries. The method may further include generating a first discretized model of the quantum computing device model. The first discretized model may divide the quantum computing device model into a first plurality of cells. The first discretized model may indicate a respective estimated boundary for each quantum computing device component. The method may further include solving a first differential equation discretized with the first discretized model. The method may further include generating a second discretized model of a focus region of the quantum computing device model. The second discretized model may divide the focus region into a second plurality of cells. The focus region may be bounded at least in part by the estimated boundary indicated in the first discretized model for a quantum computing device component of the plurality of quantum computing device components. The method may further include solving a second differential equation discretized with the second discretized model.

According to this aspect, the quantum computing device model may further indicate a respective material of each quantum computing device component.

According to this aspect, at least one actual boundary of the plurality of actual boundaries included in the quantum computing device model may be a boundary between a superconductor and a semiconductor.

According to this aspect, at least one of the first discretized model and the second discretized model may be a finite difference model.

According to this aspect, at least one of the first discretized model and the second discretized model may be a finite element model.

According to this aspect, one or more of the second plurality of cells may be smaller than one or more of the first plurality of cells.

According to this aspect, the first differential equation and the second differential equation may each be selected from the group consisting of a Schrödinger equation, a Poisson equation, and a Bogoliubov-de Gennes equation.

According to another aspect of the present disclosure, a computing device is provided, including memory storing a device model. The device model may include a plurality of device components having a respective plurality of actual boundaries. The computing device may further include a processor configured to generate a first discretized model of the device model. The first discretized model may divide the device model into a first plurality of cells via finite difference analysis or finite element analysis. The first discretized model may indicate a respective estimated boundary for each device component. The processor may be further configured to solve a first differential equation discretized with the first discretized model. The processor may be further configured to generate a second discretized model of a focus region of the device model. The second discretized model may divide the focus region into a second plurality of cells via finite difference analysis or finite element analysis. The focus region may be bounded at least in part by the estimated boundary indicated in the first discretized model for a device component of the plurality of device components. One or more of the second plurality of cells are smaller than one or more of the first plurality of cells. The processor may be further configured to solve a second differential equation discretized with the second discretized model.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A computing device comprising:
   memory storing a plurality of quantum computing device models representing a plurality of architectures, wherein, for each of the quantum computing device models:
   the quantum computing device model includes a plurality of quantum computing device components having a respective plurality of actual boundaries; and
   the quantum computing device model further indicates a respective material of each quantum computing device component; and
   a processor configured to:
   for each of the quantum computing device models:
   generate a first discretized model of the quantum computing device model, wherein:
   the first discretized model divides the quantum computing device model into a first plurality of cells; and
   the first discretized model indicates a respective estimated boundary for each quantum computing device component;
   solve one or more first differential equations discretized with the first discretized model;
   generate a second discretized model of a focus region of the quantum computing device model, wherein:
   the second discretized model divides the focus region into a second plurality of cells; and
   the focus region is bounded at least in part by the estimated boundary indicated in the first discretized model for a quantum computing device component of the plurality of quantum computing device components; and
   solve one or more second differential equations discretized with the second discretized model, thereby solving the one or more first differential equations and the one or more second differential equations more efficiently using different discretization levels for quantum computing device components formed from the different respective materials as compared to using a same discretization level, wherein the one or more first differential equations and the one or more second differential equations are each selected from the group consisting of a Schrödinger equation, a Poisson equation, and a Bogoliubov-de Gennes equation;
   select a quantum computing device model from among the plurality of quantum computing device models based at least in part on respective solutions to the one or more first differential equations and the one or more second differential equation computed for each of the plurality of quantum computing device models; and
   output the selection of the quantum computing device model.

2. The computing device of claim 1, wherein at least one actual boundary of the plurality of actual boundaries included in the quantum computing device model is a boundary between a superconductor and a semiconductor.

3. The computing device of claim 1, wherein at least one of the first discretized model and the second discretized model is a finite difference model.

4. The computing device of claim 3, wherein the finite difference model divides the quantum computing device model into a grid of rectangular cells.

5. The computing device of claim 1, wherein at least one of the first discretized model and the second discretized model is a finite element model.

6. The computing device of claim 5, wherein the finite element model includes a bounding box tree indicating, for each of the quantum computing device components, one or more cells of the finite element model corresponding to that quantum computing device component.

7. The computing device of claim 1, wherein one or more of the second plurality of cells are smaller than one or more of the first plurality of cells.

8. The computing device of claim 1, wherein the quantum computing device model is a two-dimensional model.

9. The computing device of claim 1, wherein the quantum computing device model is a three-dimensional model.

10. The computing device of claim 1, further comprising a display and a user input device, wherein the processor is further configured to:
   output a graphical user interface (GUI) for display on the display;
   via the user input device, receive user input at the GUI specifying one or more parameters of the quantum computing device model, the first discretized model, the second discretized model, the one or more first differential equations, and/or the one or more second differential equations; and output a solution to the one or more first differential equations and/or a solution to the one or more second differential equations for display on the display.

11. A method for use with a computing device, the method comprising:
storing a plurality of quantum computing device models representing a plurality of architectures in memory, wherein, for each of the quantum computing device models:
the quantum computing device model includes a plurality of quantum computing device components having a respective plurality of actual boundaries; and
the quantum computing device model further indicates a respective material of each quantum computing device component;
for each of the quantum computing device models:
generating a first discretized model of the quantum computing device model, wherein:
the first discretized model divides the quantum computing device model into a first plurality of cells; and
the first discretized model indicates a respective estimated boundary for each quantum computing device component;
solving one or more first differential equations discretized with the first discretized model;
generating a second discretized model of a focus region of the quantum computing device model, wherein:
the second discretized model divides the focus region into a second plurality of cells; and
the focus region is bounded at least in part by the estimated boundary indicated in the first discretized model for a quantum computing device component of the plurality of quantum computing device components; and
solving one or more second differential equations discretized with the second discretized model, thereby solving the one or more first differential equations and the one or more second differential equations more efficiently using different discretization levels for quantum computing device components formed from the different respective materials as compared to using a same discretization level, wherein the one or more first differential equations and the one or more second differential equations are each selected from the group consisting of a Schrödinger equation, a Poisson equation, and a Bogoliubov-de Gennes equation;
selecting a quantum computing device model from among the plurality of quantum computing device models based at least in part on respective solutions to the one or more first differential equations and the one or more second differential equation computed for each of the plurality of quantum computing device models; and
outputting the selection of the quantum computing device model.

12. The method of claim 11, wherein at least one actual boundary of the plurality of actual boundaries included in the quantum computing device model is a boundary between a superconductor and a semiconductor.

13. The method of claim 11, wherein at least one of the first discretized model and the second discretized model is a finite difference model.

14. The method of claim 11, wherein at least one of the first discretized model and the second discretized model is a finite element model.

15. The method of claim 11, wherein one or more of the second plurality of cells are smaller than one or more of the first plurality of cells.

* * * * *